United States Patent
Sun et al.

(10) Patent No.: US 10,672,343 B2
(45) Date of Patent: Jun. 2, 2020

(54) SIGNAL CONTROL APPARATUS AND METHOD, DISPLAY CONTROL APPARATUS AND METHOD, AND DISPLAY APPARATUS

(71) Applicants: BOE Technology Group Co., Ltd., Beijing (CN); Chengdu BOE Optoelectronics Technology Co., Ltd., Chengdu (CN)

(72) Inventors: Kuo Sun, Beijing (CN); Tian Dong, Beijing (CN); Guoqiang Ma, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 0 days.

(21) Appl. No.: 16/123,626

(22) Filed: Sep. 6, 2018

(65) Prior Publication Data

US 2019/0244569 A1    Aug. 8, 2019

(30) Foreign Application Priority Data

Feb. 2, 2018  (CN) .......................... 2018 1 0107891

(51) Int. Cl.
  *G09G 3/3266* (2016.01)
  *G09G 3/3233* (2016.01)
  (Continued)

(52) U.S. Cl.
  CPC ......... *G09G 3/3266* (2013.01); *G09G 3/3233* (2013.01); *G09G 3/3291* (2013.01);
  (Continued)

(58) Field of Classification Search
  None
  See application file for complete search history.

(56) References Cited

U.S. PATENT DOCUMENTS

| | | |
|---|---|---|
| 8,730,132 B2 | 5/2014 | Choi et al. |
| 2005/0156829 A1 | 7/2005 | Choi et al. |

(Continued)

FOREIGN PATENT DOCUMENTS

| | | |
|---|---|---|
| CN | 1932939 A | 3/2007 |
| CN | 101826311 A | 9/2010 |

(Continued)

OTHER PUBLICATIONS

First Office Action, including Search Report, for Chinese Patent Application No. 201810107891.9, dated Jan. 20, 2020, 21 pages.

*Primary Examiner* — Duane N Taylor, Jr.
(74) *Attorney, Agent, or Firm* — Westman, Champlin & Koehler, P.A.

(57) ABSTRACT

The present disclosure discloses a signal control apparatus and method, a display control apparatus and method, and a display apparatus. The display apparatus comprises M rows*N columns of pixel driving circuits arranged in an array, wherein the M pixel driving circuits of each column of pixel driving circuits are divided into k groups. The signal control apparatus comprises: a phase shifting circuit configured to provide a scanning signal to a pixel driving circuit to cause the pixel driving circuit to enter a data signal writing phase, wherein a phase difference between scanning signals of adjacent two pixel driving circuits in the same group of pixel driving circuits in the same column of pixel driving circuits is T, and a phase difference between scanning signals of adjacent two pixel driving circuits in the same column of pixel driving circuits is T/k; a write control circuit configured to provide a data signal from a data signal terminal to a pixel driving circuit for a data writing period of $T_i=T/k$; and a matching control circuit configured to control the write control circuit to provide the data signal to a pixel driving circuit that receives a scanning signal.

15 Claims, 8 Drawing Sheets

(51) Int. Cl.
  *G09G 3/3291*   (2016.01)
  *H01L 27/32*    (2006.01)
(52) U.S. Cl.
  CPC . *H01L 27/3244* (2013.01); *G09G 2300/0809* (2013.01); *G09G 2310/0248* (2013.01); *G09G 2310/0286* (2013.01)

(56) References Cited

U.S. PATENT DOCUMENTS

| | | | | |
|---|---|---|---|---|
| 2005/0264500 A1* | 12/2005 | Shirasaki | ............ | G11C 27/028 345/77 |
| 2007/0057877 A1 | 3/2007 | Choi et al. | | |
| 2016/0012774 A1* | 1/2016 | Ohara | ................ | G09G 3/2025 345/694 |
| 2017/0162101 A1* | 6/2017 | Ohara | ................ | G09G 3/3233 |
| 2017/0200412 A1* | 7/2017 | Gu | ....................... | G09G 3/3233 |
| 2018/0059464 A1* | 3/2018 | Asaumi | ............... | G09G 3/3666 |
| 2018/0174507 A1* | 6/2018 | Ohara | ................... | H01L 51/50 |
| 2018/0261176 A1* | 9/2018 | Li | ........................ | G09G 3/3648 |
| 2019/0114954 A1 | 4/2019 | Xuan et al. | | |

FOREIGN PATENT DOCUMENTS

| | | | |
|---|---|---|---|
| CN | 105761675 A | 7/2016 |
| CN | 107564478 A | 1/2018 |
| CN | 107610640 A | 1/2018 |

\* cited by examiner

SIGNAL CONTROL APPARATUS AND METHOD, DISPLAY CONTROL APPARATUS AND METHOD, AND DISPLAY APPARATUS

CROSS-REFERENCE TO RELATED APPLICATION(S)

The present disclosure claims priority to Chinese Patent Application No. 201810107891.9, entitled "Signal Control Apparatus and Method, Display Control Apparatus and Method, Display Apparatus", filed on Feb. 2, 2018, which is incorporated herein by reference in its entirety.

TECHNICAL FIELD

The present disclosure relates to the field of display technologies, and in particular, to a signal control apparatus and method, a display control apparatus and method, and a display apparatus.

BACKGROUND

An OLED display apparatus is a display screen made of organic electroluminescent diode, which has good self-luminous performance and display performance, and is considered as an emerging application technology of a next generation of a flat panel display.

The OLED display apparatus mainly comprises a display control circuit and an OLED display substrate. The display control circuit outputs a scanning signal and a data signal which match each other, to drive different pixels in the OLED display substrate by using the scanning signal and the data signal which match each other, thereby realizing screen display of the OLED display apparatus.

SUMMARY

A first aspect of the present disclosure provides a signal control apparatus for a display apparatus, the display apparatus comprising M rows by N columns of pixel driving circuits arranged in an array, wherein the M pixel driving circuits of each column of pixel driving circuits are divided into k groups, wherein k is greater than or equal to 2 and less than N, the ith pixel driving circuit of each column of pixel driving circuits is assigned to the [i Module k]th group, and the same group of pixel driving circuits are connected to a same data line to receive a data signal, and data lines connected to different groups of pixel driving circuits are different, the signal control apparatus including:

a phase shifting circuit configured to provide a scanning signal to a pixel driving circuit to cause the pixel driving circuit to enter a data signal writing phase, wherein a phase difference between scanning signals of adjacent two pixel driving circuits in a same group of pixel driving circuits in a same column of pixel driving circuits is T, and a phase difference between scanning signals of adjacent two pixel driving circuits in the same column of pixel driving circuits is T/k, and T is a duration of the data signal writing phase of each pixel driving circuit;

a write control circuit connected to a data signal terminal, and configured to provide a data signal from the data signal terminal to the pixel driving circuit for a data writing period of $T_i = T/k$; and a matching control circuit connected to the phase shifting circuit and the write control circuit, and configured to control the write control circuit to provide the data signal to a pixel driving circuit that receives a scanning signal when the phase shifting circuit provides the scanning signal to the pixel driving circuit.

According to an embodiment of the present disclosure, a frequency of the data signal provided from the data signal terminal is $\lambda 0$, wherein $T = k/(\lambda 0 \times M)$.

According to an embodiment of the present disclosure, the phase shifting circuit includes a phase shifter and a first register, the phase shifter is connected to an input terminal of the first register, an output terminal of the first register is connected to M pairs of scanning signal terminals, and the M pairs of scanning signal terminals correspond to M pixel driving circuits in the same column of pixel driving circuits one by one, each pair of scanning lines includes a first scanning terminal and a second scanning terminal, a reset signal provided from the first scanning terminal is configured to control a duration of a reset phase of a corresponding pixel driving circuit, and a scanning signal provided from the second scanning terminal is configured to control a duration of a data signal writing phase of a corresponding pixel driving circuit, the phase shifter is configured to modulate a trigger signal such that a phase difference between the reset signal and the scanning signal provided from the first register according to the trigger signal is T, and the matching control circuit is connected to the first register, and configured to control the write control circuit to provide the data signal to a pixel driving circuit that receives a scanning signal when the first register provides the scanning signal to the pixel driving circuit.

According to an embodiment of the present disclosure, the write control circuit includes N switching units, and the N switching units correspond to N data signal terminals and N columns of pixel driving circuits one by one, and each switching unit has a control terminal connected to the matching control circuit, an input terminal connected to a corresponding data signal terminal, and an output terminal connected to k data lines of a corresponding column of pixel driving circuits.

According to an embodiment of the present disclosure, the write control circuit further includes a second register and k control signal that correspond to the switching units, each switching unit includes k switching devices, and k control signal terminals correspond to k switching devices included in each switching unit one by one, the second register is connected to the matching control circuit and the k control signal terminals, and the k control signal terminals are connected to control terminals of the k switching devices included in each switching unit respectively, input terminals of the k switching devices included in each switching unit are connected to corresponding data signal terminals, and output terminals of the k switching devices included in each switching unit are connected to k data lines of a corresponding column of pixel driving circuits respectively, and the second register is configured to control the k switching devices in each switching units to be sequentially turned on, such that a time difference between turn-on times of adjacent two switching devices in each switching unit is T/k, and each switching device remains to be turned on for a period of T/k.

According to an embodiment of the present disclosure, the signal control apparatus further includes an light emitting signal modulation circuit connected to the matching control circuit, the matching control circuit is configured to control the light emitting signal modulation circuit to generate a light emitting signal at the end of the data signal writing phase, and control the pixel driving circuit to drive a light emitting device to emit light.

A second aspect of the present disclosure further provides a signal control method applied to the signal control apparatus as described above, including:

providing a scanning signal to a pixel driving circuit, so that the pixel driving circuit enters a data signal writing phase, wherein a phase difference between scanning signals of adjacent two pixel driving circuits in the same group of pixel driving circuits in the same column of pixel driving circuits is T, and a phase difference between scanning signals of adjacent two pixel driving circuits in the same column of pixel driving circuits is T/k, and T is a duration of the data signal writing phase of each pixel driving circuit; and providing a data signal to a pixel driving circuit that receives a scanning signal for a data writing period of $T_i=T/k$, when the scanning signal is provided to the pixel driving circuit.

According to an embodiment of the present disclosure, before providing the scanning signal to the pixel driving circuit, the signal control method further includes:

providing a reset signal to the pixel driving circuit to cause the pixel driving circuit to enter a reset phase, wherein a duration of the reset phase is T.

According to an embodiment of the present disclosure, after the data signal writing phase, the signal control method further includes:

controlling the pixel driving circuit to drive a light emitting device to emit light.

A third aspect of the present disclosure further provides a display control apparatus comprising the signal control apparatus as described above.

The present disclosure further provides a signal control method applied to the signal control apparatus as described above, including:

a data writing step of providing a scanning signal to a current row of pixel driving circuits, so that the current row of pixel driving circuits enters a data signal writing phase, a duration of the data signal writing phase is T, and at the same time, providing a data signal from a data signal terminal to the current row of pixel driving circuit, such that the current row of pixel driving circuits writes the data signal for a data writing period of $T_i=T/k$; when the data writing period lapses, stopping providing the data signal to the current row of pixel driving circuits via the data signal terminal, and proceeding to a mutual capacitance charging step;

the mutual capacitance charging step of utilizing a mutual capacitance of a data line corresponding to each pixel driving circuit in the current row of pixel driving circuits, so that the data line corresponding to each pixel driving circuit in the current row of pixel driving circuits charges the corresponding pixel driving circuit until the data signal writing phase of the pixel driving circuit ends.

According to an embodiment of the present disclosure, the signal control method further includes:

performing the data writing step and the mutual capacitance charging step for a next row of pixel driving circuits.

According to an embodiment of the present disclosure, after the mutual capacitance charging step, the signal control method further includes:

a driving step of controlling the pixel driving circuit to drive a light emitting device to emit light.

According to an embodiment of the present disclosure, before the data writing step, the signal control method further includes:

a resetting step of providing a reset signal to the current row of pixel driving circuits to cause the current row of pixel driving circuits to enter a reset phase, wherein a duration of the reset phase is T.

A fourth aspect of the present disclosure further provides a display apparatus comprising the display control apparatus as described above.

BRIEF DESCRIPTION OF THE DRAWINGS

The drawings described herein are intended to provide a further understanding of the present disclosure, and are intended to be a part of the present disclosure. The illustrative embodiments of the present disclosure and the description thereof are for explaining the present disclosure and do not constitute an undue limitation of the present disclosure. In the drawings.

DETAILED DESCRIPTION

Figure 1:
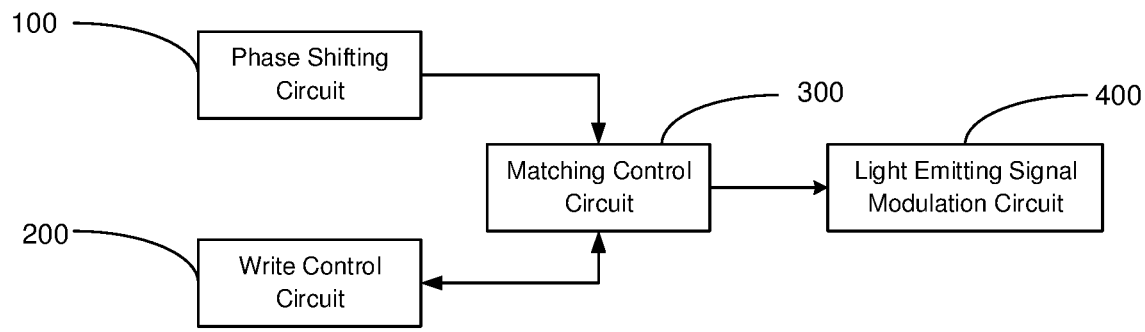
FIG. 1 is a structure block diagram of a signal control apparatus according to an embodiment of the present disclosure.

The technical solutions in the embodiments of the present disclosure are clearly and completely described in the following with reference to the accompanying drawings in the embodiments of the present disclosure. It is obvious that the described embodiments are only a part of the embodiments of the present disclosure, and not all of the embodiments. All other embodiments obtained by those of ordinary skill in the art based on the embodiments of the present disclosure without creative efforts are within the scope of the present disclosure.

When an OLED display apparatus performs screen display, the frequency of the data signal used is relatively small (60 Hz), and the time taken for the OLED display apparatus to display one frame of screen is long, resulting in poor fluency of the screen displayed by the OLED display apparatus. When the frequency of the data signal used is relatively high (120 Hz), the time period taken for the OLED display apparatus to display one frame of screen is relatively short, and fluency of the screen displayed by the OLED display apparatus is good.

However, when the frequency of the data signal used is higher, the time period for writing the data signal to a corresponding pixel is shorter, which causes the pixel to emit light with insufficient data signal written, and easily causes a problem of insufficient light emitting brightness, thereby affecting display effect of the OLED display apparatus.

According to the technical solution of the present disclosure, a high frequency data signal may be used to drive the display apparatus to display, thereby improving display effect of the display apparatus.

Referring to FIG. 1 to FIG. 6, a signal control apparatus for a display apparatus according to an embodiment of the present disclosure includes: a phase shifting circuit 100, a write control circuit 200, and a matching control circuit 300. The display apparatus comprises an array of M rows by N columns of pixel driving circuits, wherein the M pixel driving circuits of each column of pixel driving circuits are divided into k groups, wherein k is greater than or equal to 2 and less than N, and the ith pixel driving circuit of each column of pixel driving circuits is assigned to the [i Module k]th group, and a same group of pixel driving circuits are connected to a same data line to receive a data signal, and the data lines connected to different groups of pixel driving circuits are different. That is, for each column of pixel driving circuits, there are k data lines. The number of pixel driving circuits included in each group of pixel driving circuits is at least 1. Assuming that each group of pixel driving circuits includes a number r of pixel driving circuits, the number r of pixel driving circuits are arranged in a corresponding group according to the number of the row at which they are located.

The phase shifting circuit 100 is configured to provide a scanning signal to the pixel driving circuit to cause the pixel driving circuit to enter a data signal writing phase, wherein a phase difference between the scanning signals of adjacent two pixel driving circuits in the same group of pixel driving circuits in the same column of pixel driving circuits is T, and a phase difference between the scanning signals of adjacent two pixel driving circuits in the same column of pixel driving circuits is T/k, and T is a duration of the data signal writing phase of each pixel driving circuit.

The write control circuit 200 is connected to a data signal terminal Vdata, and configured to provide a data signal from the data signal terminal to the pixel driving circuit for a data writing period of $T_i=T/k$.

The matching control circuit 300 is connected to the phase shifting circuit 100 and to the write control circuit 200, and configured to control the write control circuit 200 to provide a data signal to a pixel driving circuit that receives a scanning signal, when the phase shifting circuit 100 provides the scanning signal to the pixel driving circuit.

Since the phase difference between the scanning signals of adjacent two pixel driving circuits in the same column of pixel driving circuits is T/k, the data writing start times of adjacent two pixel driving circuits in the same column of pixel driving circuit are different by T/k.

Figure 2:
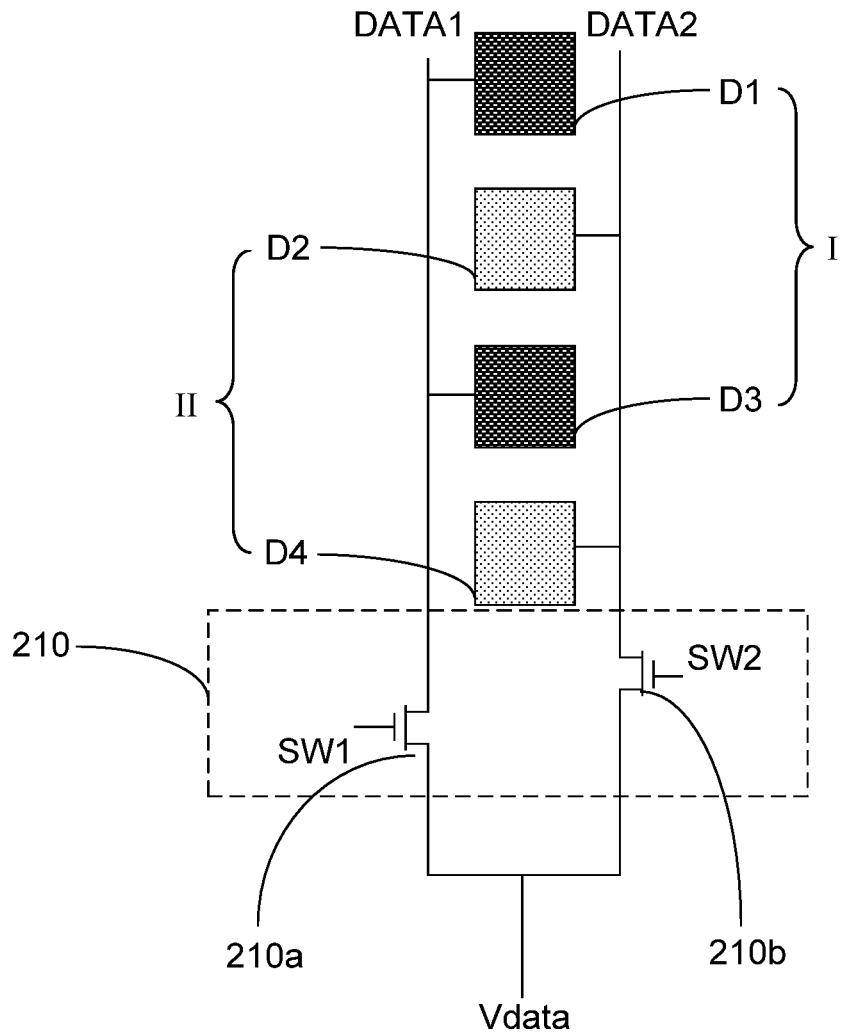
FIG. 2 is a wiring diagram of 1 column by 4 rows of pixel driving circuits according to an embodiment of the present disclosure.
Figure 3:
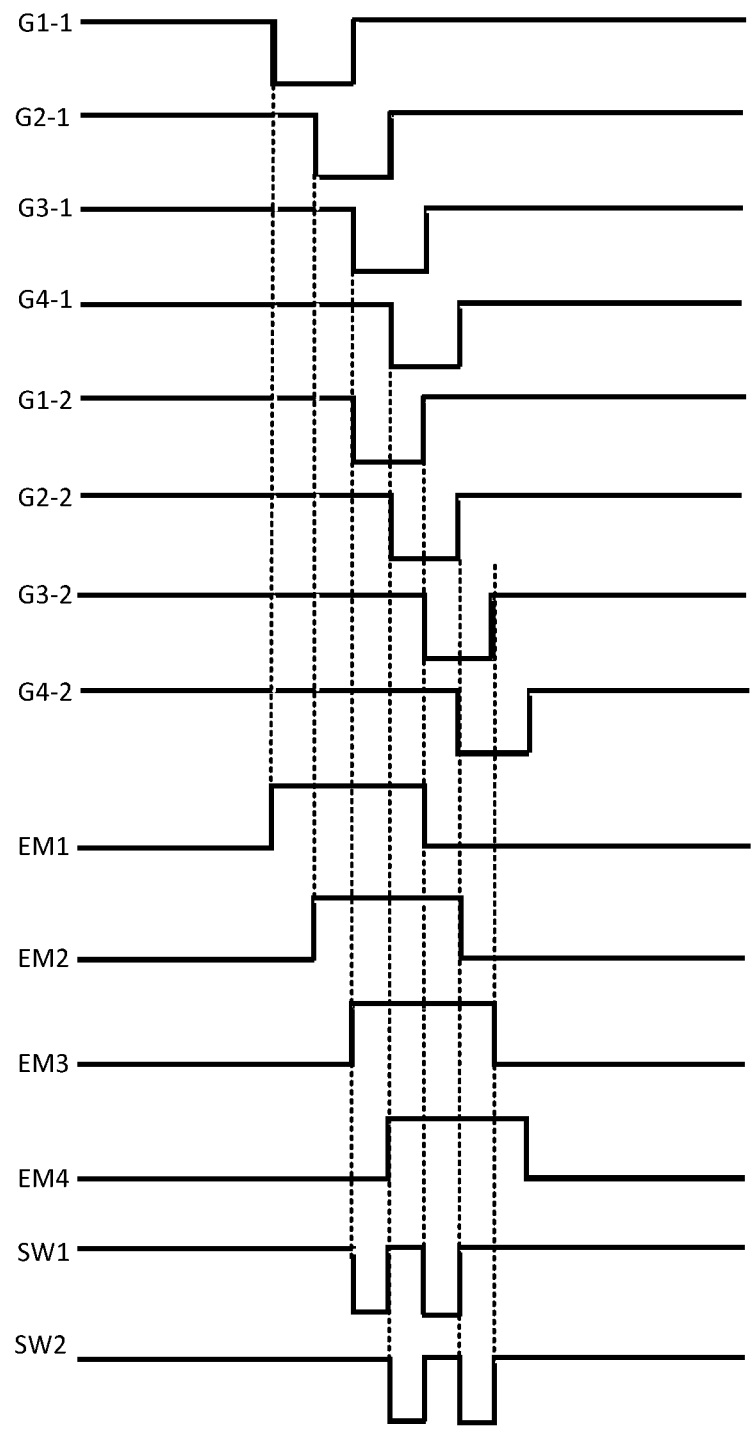
FIG. 3 is a signal control timing diagram according to an embodiment of the present disclosure.
Figure 4:
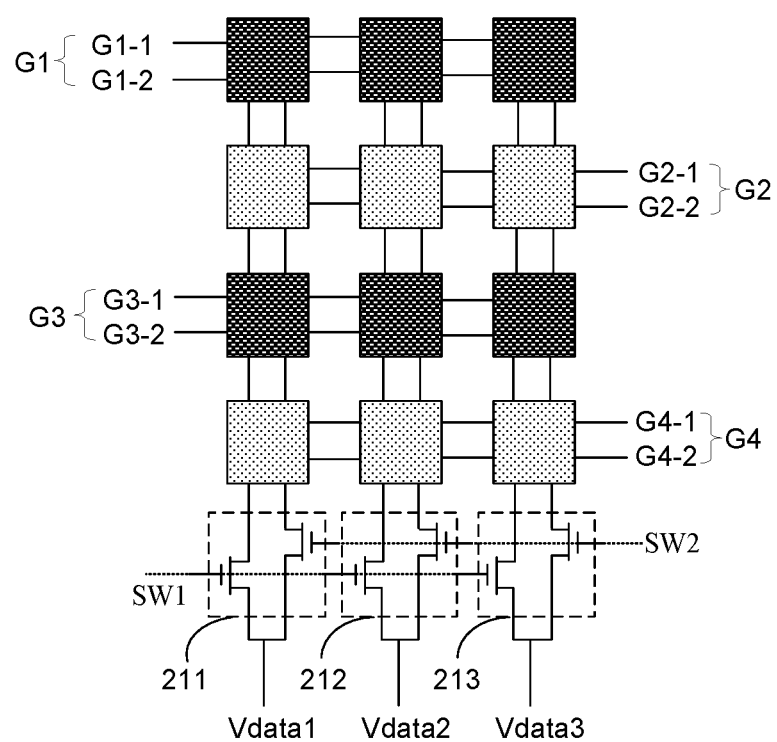
FIG. 4 is a wiring diagram of 3 columns by 4 rows of pixel driving circuits according to an embodiment of the present disclosure.

In order to more clearly illustrate the signal control device according to the embodiment of the present disclosure, applying the signal control apparatus to 1 column by 4 rows of pixel driving circuits shown in FIG. 2 and 3 columns by 4 rows of pixel driving circuits shown in FIG. 4 is described in detail.

In FIG. 2 and FIG. 4, M=4 and k=2. The pixel driving circuits filled with the same shading belong to the same group of pixel driving circuits. For FIG. 2 and FIG. 4, one column of pixel driving circuits is divided into two groups, each group of pixel driving circuits includes two pixel driving circuits; for one column of pixel driving circuits, the first group I of pixel driving circuits includes a first pixel driving circuit D1 and a third pixel driving circuit D3, and the second group II of pixel driving circuits includes a second row D2 of pixel driving circuits and a fourth row D4 of pixel driving circuits. A column of pixel driving circuits includes a first data line DATA1 and a second data line DATA2, which correspond to the first group I of pixel driving circuits and the second group II of pixel driving circuits, respectively. The first data line DATA1 is respectively connected to the first pixel driving circuit D1 and the third pixel driving circuit D3 included in the first group I of pixel driving circuits. The second data line DATA2 is connected to the second pixel driving circuit D2 and the fourth pixel driving circuit D4 included in the second group II of pixel driving circuits.

Exemplarily, the phase shifting circuit 100 phase shifts the scanning signals of the first group I of pixel driving circuits and the second group II of pixel driving circuits in the same column of pixel driving circuits, so that the phase difference between the scanning signal of the pixel driving circuit D1 and the scanning signal of the third pixel driving circuit D3 included in the first group I of pixel driving circuits is T, and the phase difference between the scanning signal of the second pixel driving circuit D2 and the fourth pixel driving circuit D4 included in the second group II of pixel driving circuits is T. Meanwhile, the phase difference between scanning signals of adjacent two pixel driving circuits in the same column is T/2. Taking FIG. 2 as an example, the first pixel driving circuit D1 is adjacent to the second pixel driving circuit D2, the second pixel driving circuit D2 is adjacent to the third pixel driving circuit D3, and the third pixel driving circuit D3 is adjacent to the fourth pixel driving circuit D4. It can be seen from FIG. 3 that the scanning signal of the first pixel driving circuit D1 and the scanning signal of the second pixel driving circuit D2 have a phase difference of T/2, the scanning signal of the second pixel driving circuit D2 and the scanning signal of the third pixel driving circuit D3 have a phase difference of T/2, the scanning signal of the third pixel driving circuit D3 and the scanning signal of the fourth pixel driving circuit D4 have a phase difference of T/2, and T is a duration of the data signal writing phase of each pixel driving circuit.

The write control circuit 200 provides a data signal to the pixel driving circuit for a data writing period of $T_i=T/2$.

In the above case, for the same column of pixel driving circuits, the phase shifting circuit 100 transmits the scanning signal to the first row of pixel driving circuits for a period. When the period reaches T/2, the phase shifting circuit 100 transmits the scanning signal to the second row of pixel driving circuits. When the period reaches T, the phase shifting circuit 100 transmits the scanning signal to the third row of pixel driving circuits, and when the period reaches 3T/2, the phase shifting circuit 100 transmits the scanning signal to the fourth row of pixel driving circuits. It can be seen that, for one column by four rows of pixel driving circuits, the signal control apparatus according to the embodiment of the present disclosure sequentially starts to output the scanning signal to four rows of pixel driving circuits within a time period of 2T, which is reduced by half compared with the conventional time period of 4T.

As shown in FIG. 3, the matching control circuit 300 controls the write control circuit 200 to provide the data signal to a pixel driving circuit that receives a scanning signal when the phase shift circuit 100 provides the scanning signal to the pixel driving circuit. The duration of the data signal writing phase of each pixel driving circuit is T. The write control circuit 200 provides the data signal to the first row of pixel driving circuits when the first row of pixel driving circuits receive the scanning signal to enter the data signal writing phase. When the period after the first row of pixel driving circuit enters the data signal writing phase reaches T/2 (i.e., the data writing period), the write control circuit 200 stops providing the data signal to the first row of pixel driving circuits, and starts to provide the data signal to the second row of pixel driving circuits. A mutual capacitance between the first data line DATA1 and other wires occurs when transmitting the data signal to the first row of pixel driving circuits. Therefore, although the write control circuit 200 stops providing the data signal to the first row of pixel driving circuits, the mutual capacitance of the first data line DATA1 (a capacitance of about 20 pF) causes the first data line DATA1 to continue charging the first row of pixel driving circuits until the period after the first row of pixel driving circuits enters the data signal writing phase reaches T. That is, the first row of pixel driving circuits ends the data signal writing phase, and the first data line DATA1 stops charging the first row of pixel driving circuits. At this time, the period after the second row of pixel driving circuits enters the data signal writing phase reaches T/2, the write control circuit 200 stops providing the data signal to the second row of pixel driving circuits, and starts to provide the data signal to the third row of pixel driving circuits. Similarly, after the write control circuit 200 stops providing the data signal to the second row of pixel driving circuits, the mutual capacitance between the second data line DATA2 and the other wires occurring when transmitting the data signal to the second row of pixel driving circuits causes the second data line DATA2 to continue charging the second row of pixel driving circuits until the period after the second row of pixel driving circuits enters the data signal writing phase reaches T. That is, the second row of pixel driving circuits ends the data signal writing phase, and the second data line DATA2 stops charging the second row of pixel driving circuits. At this time, the period after the third row of pixel driving circuits enters the data signal writing phase reaches T/2, the write control circuit 200 stops providing the data signal to the third row of pixel driving circuits, and starts to provide the data signal to the fourth row of pixel driving circuits. Similarly, after the write control circuit 200 stops providing the data signal to the third row of pixel driving circuits, the mutual capacitance between the first data line DATA1 and the other wires occurring when transmitting the data signal to the third row pixel driving circuits causes the first data line DATA1 to continue charging the third row of pixel driving circuits until the period after the third row of pixel driving circuits enters the data signal writing phase reaches T. That is, the third row of pixel driving circuits ends the data signal writing phase. At this time, the period after the fourth row of pixel driving circuits enters the data signal writing phase reaches T/2, and the write control circuit 200 stops providing the data signal to the fourth row of pixel driving circuits. Similarly, after the write control circuit 200 stops providing the data signal to the fourth row of pixel driving circuits, the mutual capacitance between the second data line DATA2 and the other wires occurring when transmitting the data signal to the fourth row of pixel driving circuits causes the second data line DATA2 to continue charging the fourth row of pixel driving circuits until the period after the fourth row of pixel driving circuits enters the data signal writing phase reaches T. That is, the fourth row of pixel driving circuits ends the data signal writing phase.

It can be seen from the specific implementation of the signal control apparatus according to the embodiments of the present disclosure that the write control circuit 200 controls the data writing period of each pixel driving circuit in a column of pixel driving circuits corresponding to a data signal terminal Vdata to be $T_i=T/k$ (k is at least 2) such that the data writing starting times of adjacent two pixel driving circuits in a column of pixel driving circuit corresponding to the data signal terminal Vdata have a time difference of T/k; that is, for a column of pixel driving circuits, in one data signal writing phase of a pixel driving circuit, the write control circuit 200 can output a data signal to k different pixel driving circuits. The phase shifting circuit 100 causes the scanning signals outputted to adjacent two pixel driving circuits in the same group of pixel driving circuits of the same column of pixel driving circuits to have a phase difference of T, and causes the scanning signals outputted to two adjacent pixel driving circuits in the same column of pixel driving circuits to have a phase difference of T/k. That is, for the same column of pixel driving circuits, the phase shifting circuit 100 can start to output scanning signals to k different pixel driving circuits in one scanning signal output phase T.

It can be seen that, for a column of pixel driving circuits, in the duration of one data signal writing phase, the write control circuit 200 can complete the data signal output of k different pixel driving circuits, and the phase shifting circuit 100 outputs the scanning signals to k different pixel driving circuits in the duration of one scanning signal output phase. Since the matching control circuit 300 controls the write control circuit 200 to provide the data signal to a pixel driving circuit that receives a scanning signal when the phase shifting circuit 100 provides the scanning signal to the pixel driving circuit, so that in the duration of one data signal writing phase, the phase shifting circuit 100 can sequentially provide the scanning signal to k different pixel driving circuits to ensure k different pixel driving circuits that receive the scanning signal to complete data signal writing. Therefore, in the signal control apparatus according to the embodiment of the present disclosure, when a column of pixel driving circuits has M (at least 2) pixel driving circuits, the time period required for completing data signal writing of the column of pixel driving circuits is TM/k, while in the related art, the time period is TM. That is to say, it is possible for the signal control apparatus according to the present disclosure of the embodiment to drive a display screen with a high-frequency data so that the refresh rate of display screen increase, thereby improving the fluidity of the display screen.

Exemplarily, as shown in FIG. 2, when the frequency of the data signal provided from the data signal terminal Vdata is λ0, the time period required for data signal writing of one frame screen is 1/λ0, and T=k/(λ0×M), wherein M is the number of pixel driving circuits in a column of pixel driving circuits, and M is an integer greater than or equal to 2.

For example, in the related art, if λ0=60 Hz and M=1920, the duration of the data signal writing phase of one pixel driving circuit is 1/(λ0×M)=1/(60×1920)=8.6 μs, and if λ0=120 Hz and M=1920, the duration of the data signal writing phase of one pixel driving circuit is 1/(λ0×M)=1/(120×1920)=4.3 μs. However, in the signal control apparatus according to the embodiment of the present disclosure, if k=2, the duration of the data signal writing phase of one pixel driving circuit is $2/(\lambda 0 \times M)=2/(120 \times 1920)=8.6$ μs.

For example, in the related art, if $\lambda 0=60$ Hz and M=2560, the duration of the data signal writing phase of one pixel driving circuit is $1/(\lambda 0 \times M)=1/(60 \times 2560)=6.5$ μs, and if $\lambda 0=120$ Hz and M=1920, the duration of the data signal phase of one pixel driving circuit is $1/(\lambda 0 \times M)=1/(120 \times 2560)=3.25$ μs. However, in the signal control apparatus according to the embodiment of the present disclosure, if k=2, the duration of the data signal writing phase of one pixel driving circuit is $2/(\lambda 0 \times M)=2/(120 \times 2560)=6.5$ μs.

It can be seen that the signal control apparatus according to the embodiment of the present disclosure can control the phase of the scanning signal received by the pixel driving circuit and the data writing period, so that when the data signal terminal Vdata outputs a high frequency data signal, not only display time period of one frame image is reduced, but also the displayed image is enabled to achieve the same light emitting brightness effect as that with a low frequency data signal.

In addition, in the signal control apparatus according to the embodiment of the present disclosure, although the data writing period of each pixel driving circuit is $T_i=T/k$, the period (T) of the scanning signal provided from the phase shifting circuit 100 does not change. When the matching control circuit 300 controls the write control circuit 200 to stop providing the data signal to the pixel driving circuit that receives the scanning signal, the phase shifting circuit 100 still provides the scanning signal to the pixel driving circuit. The data line corresponding to the pixel driving circuit that receives the scanning signal has a mutual capacitance with the other wires when transmitting the data signal, so that after the write control circuit 200 provides the data signal to the pixel driving circuit that receives the scanning signal (i.e., the data writing period of $T_i=T/k$), the data line corresponding to the pixel driving circuit that receives the scanning signal can charge the pixel driving circuit that still receives the scanning signal to compensate for insufficient data signal writing due to the time period required for the write control circuit 200 to provide the data signal to the pixel driving circuit that receives the scanning signal being too short, thereby ensuring the data signal writing requirement of the pixel driving circuit, so that the brightness of the screen displayed by the display apparatus is uniform.

Figure 5:
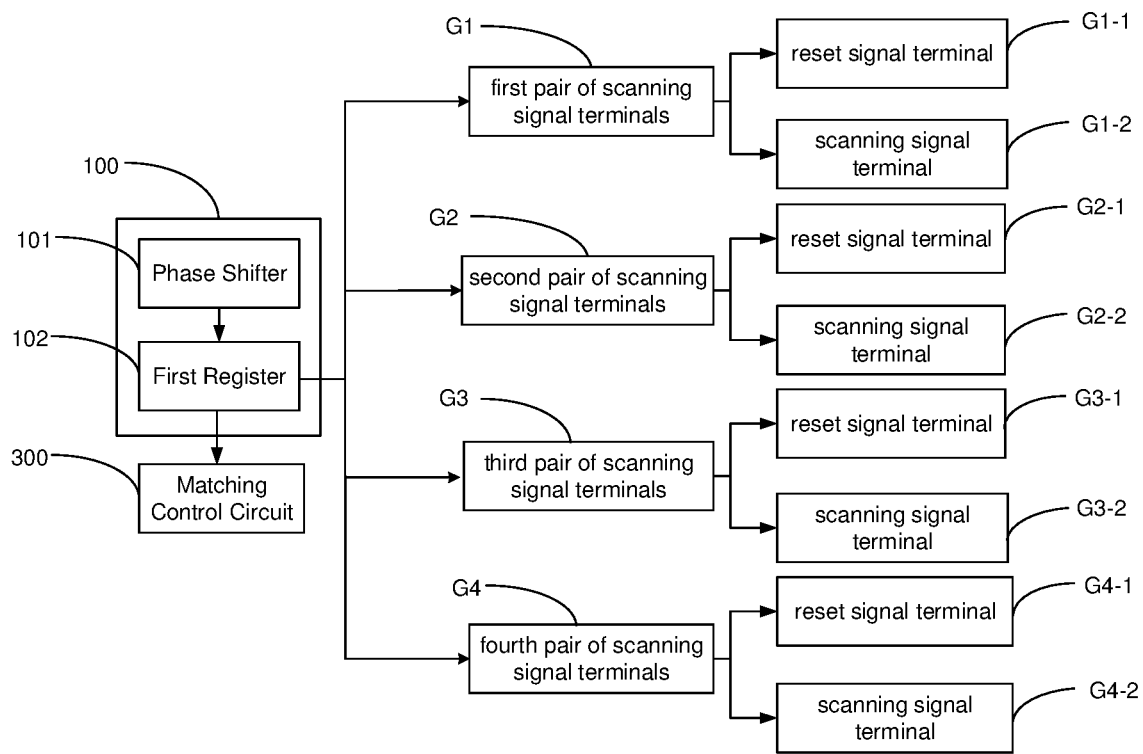
FIG. 5 is a specific block diagram of a phase shifting circuit according to an embodiment of the present disclosure.

Specifically, as shown in FIG. 4 and FIG. 5, the phase shifting circuit 100 of the embodiment of the present disclosure includes a phase shifter 101 and a first register 102. The phase shifter 101 is connected to an input of the first register 102, an output of the first register 102 is connected to M pairs of scanning signal terminals, and the M pairs of scanning signal terminal correspond to the M pixel driving circuits in the same column pixel driving circuit one by one.

Each pair of scanning lines includes a first scanning signal terminal and a second scanning signal terminal. A reset signal provided from the first scanning signal terminal is used to control a duration of a reset phase of a corresponding pixel driving circuit, and the scanning signal provided from the second scanning signal terminal is used for controlling the duration of the data signal writing phase of the corresponding pixel driving circuit.

The phase shifter 101 is configured to modulate a trigger signal such that the phase difference between the reset signal and the scanning signal provided from the first register 102 according to the trigger signal is T. A phase difference between the scanning signals of adjacent two pixel driving circuits in the same group of pixel driving circuits in the same column of pixel driving circuits is T and a phase difference between the scanning signals of adjacent two pixel driving circuits in the same column of pixel driving circuits is T/k under the control of the phase shifting circuit 100. Therefore, the phase difference between the reset signals of adjacent two pixel driving circuits in the same group of pixel driving circuits in the same column of pixel driving circuits is also T, and the phase difference between the reset signals of adjacent two pixel driving circuits in the same column of pixel driving circuits is T/k.

The matching control circuit 300 is connected to the first register 102. The matching control circuit 300 is configured to control the write control circuit 200 to provide the data signal to a pixel driving circuit that receives a scanning signal when the first register 102 provides the scanning signal to the pixel driving circuit, so as to ensure cooperative matching of scanning signals and data signals provided to the same pixel driving circuit.

Exemplarily, as shown in FIG. 2, FIG. 4 and FIG. 5, for 1 column by 4 rows or 3 columns by 4 rows of pixel driving circuits, a column of pixel driving circuits has 4 rows of pixel driving circuits. Therefore, an output of the first register 102 is connected to four pairs of scanning signal terminals, and the four pairs of scanning signal terminals are a first pair of scanning signal terminals G1, a second pair of scanning signal terminals G2, a third pair of scanning signal terminals G3, and a fourth pair of scanning signal terminals G4. The first pair of scanning signal terminals G1 includes a reset signal terminal G1-1 and a scanning signal terminal G1-2, the second pair of scanning signal terminals G2 includes a reset signal terminal G2-1 and a scanning signal terminal G2-2, a third pair of scanning signal terminal G3 includes a reset signal terminal G3-1 and a scanning signal terminal G3-2, and the fourth pair of scanning signal terminals G4 includes a reset signal terminal G4-1 and a scanning signal terminal G4-2.

As shown in FIG. 2 to FIG. 4, for a column of pixel driving circuits, the phase difference between the reset signal and the scanning signal of the pixel driving circuit is T. For example, a phase difference between a reset signal and a scanning signal of a first pixel driving circuit D1 is T, a phase difference between a reset signal and a scanning signal of a second pixel driving circuit D2 is T, and a phase difference between a reset signal and a scanning signal of a third pixel driving circuit D3 is T. A phase difference between reset signals of adjacent two pixel driving circuits in the same group of pixel driving circuits in the same column pixel driving circuit is T. For example, in a column of pixel driving circuits, a phase difference between a reset signal of the first pixel driving circuit D1 and a reset signal of the third pixel driving circuit D3 included in the first group I of pixel driving circuits is T, and a phase difference between a reset signal of the second pixel driving circuit D2 and a reset signal of a fourth pixel driving circuit D4 included in the second group II of pixel driving circuits is T.

The phase difference of the reset signals of adjacent two pixel driving circuits in the same column of pixel driving circuit is T/2. For example, in one column of pixel driving circuits, the phase difference between the reset signal of the first pixel driving circuit D1 and the reset signal of the second pixel driving circuit D2 is T/2; the phase difference between the reset signal of the second pixel driving circuit D2 and the reset signal of the third pixel driving circuit D3 is T/2; and the phase difference between the reset signal of the third pixel driving circuit D3 and the reset signal of the fourth pixel driving circuit D4 is T/2.

Since the phase difference between the reset signal and the scanning signal of one pixel driving circuit is T, the phase difference between the scanning signal of the first pixel driving circuit D1 and the scanning signal of the second pixel driving circuit D2 is T/2. The phase difference between the scanning signal of the second pixel driving circuit D2 and the scanning signal of the third pixel driving circuit D3 is T/2. The phase difference between the scanning signal of the third pixel driving circuit D3 and the scanning signal of the fourth pixel driving circuit D4 is T/2.

As can be seen from FIG. 3, the matching control circuit 300 is configured to control the write control circuit 200 to provide the data signal to a pixel driving circuit that receives a scanning signal when the first register 102 provides the scanning signal to the pixel driving circuit. That is, when the pixel driving circuit starts to receive the scanning signal, the write control circuit 200 provides the data signal to the pixel driving circuit. Since the write control circuit 200 controls the data writing period of each pixel driving circuit in a column of pixel driving circuits corresponding to the data signal terminal Vdata to be $T_i$=T/2, when the write control circuit 200 stops providing the data signal to the pixel driving circuit, the pixel driving circuit is still in the data signal writing phase, and the data signal writing phase will last for a time period of T/2. During the remaining T/2 time period, the stored charge due to the mutual capacitance (about 20 pF) of the data line connected to the pixel driving circuit occurring when transmitting the data signal is used to continue charging the pixel driving circuit.

Figure 6:
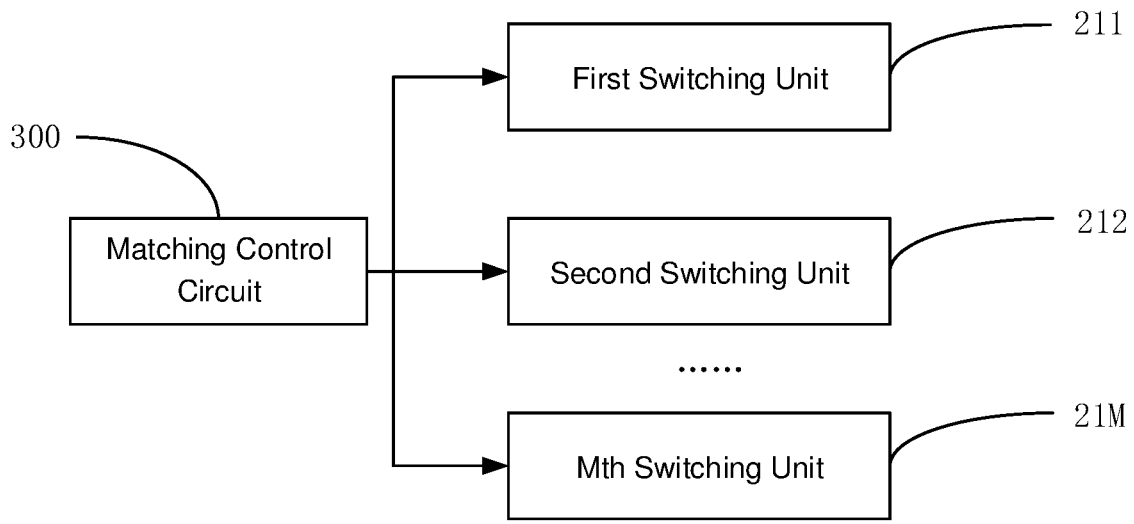
FIG. 6 is a structure block diagram of a write control circuit according to an embodiment of the present disclosure.
Figure 7:
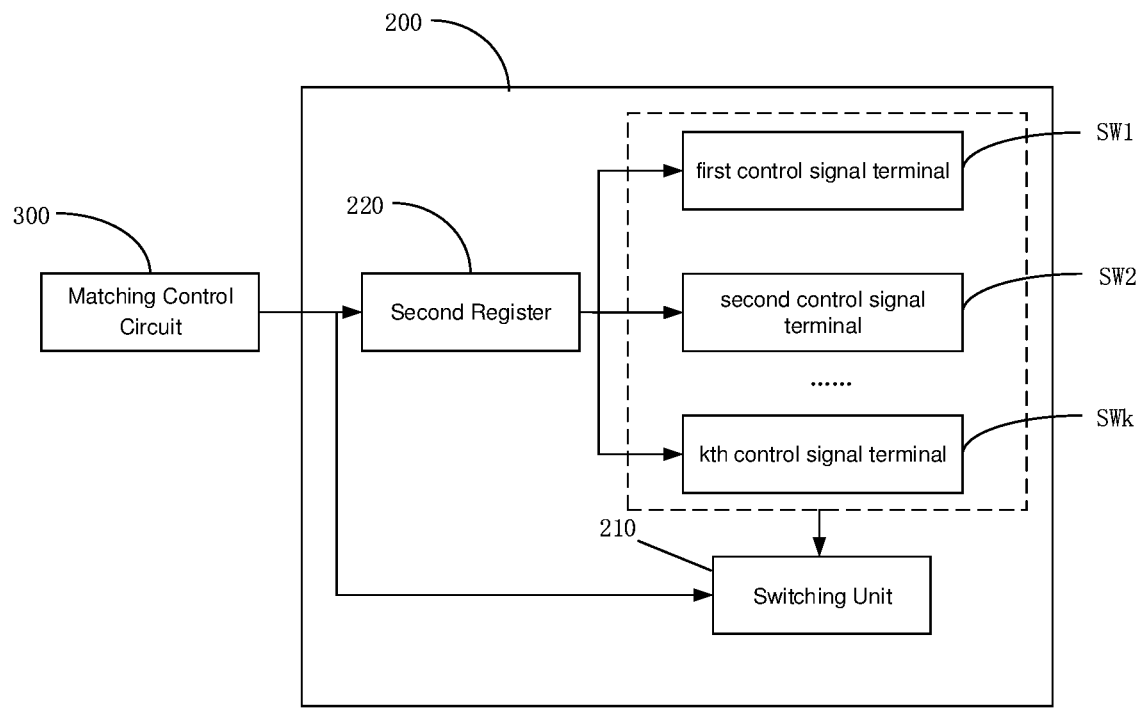
FIG. 7 is a further structure block diagram of a write control circuit according to an embodiment of the present disclosure.

Optionally, as shown in FIG. 6 and FIG. 7, the write control circuit 200 includes N switching units 210, and the N switching units 210 correspond to N data signal terminals Vdata and N columns of pixel driving circuits one by one.

The matching control circuit 300 is connected to a control terminal of the first switching unit 211, a control terminal of the second switching unit 212, . . . , a control terminal of the Mth switching unit 21M. An input terminal of each switching unit 210 is connected to corresponding data signal terminal Vdata, and an output terminal of each switching unit 210 is connected to k data lines of the corresponding column of pixel driving circuits, so that the matching control circuit 300 can control the switching unit 210.

Specifically, the write control circuit 200 further includes a second register 220 corresponding to the switching unit 210. Each switching unit 210 includes k switching devices, and an input terminal of the second register 220 is connected to the matching control circuit 300, and an output terminal of the second register 220 is connected to a first control signal terminal SW1, a second control signal terminal SW2, . . . , a kth control signal terminal SWk. The first control signal terminal SW1 is connected to a control terminal of a first switching device 210a included in the switching unit 210. The second control signal terminal SW2 is connected to a control terminal of the second switching device 210b included in the switching unit 210, . . . , the kth control signal terminal SWk is connected to a control terminal of the kth switching device included in the switching unit 210. The input terminals of the k switching devices included in each switching unit 210 are connected to corresponding data signal terminals Vdata, and the output terminals of the k switching devices included in each switching unit 210 are connected to the k data lines of a corresponding column of pixel driving circuits one by one.

The second register 220 is configured to control the k switching devices in each of the switching units 210 to be sequentially turned on, such that turn-on times of adjacent two switching devices in each switching unit 210 are different by T/k, and each switching device remains to be turned on for a period of T/k.

Exemplarily, as shown in FIG. 2, if k=2, the data lines corresponding to each column of pixel driving circuits include two data lines, which are a first data line DATA1 and a second data line DATA2 respectively. 1 column by 4 rows of pixel driving circuits shown in FIG. 2 is taken as an example below for explanation.

As shown in FIG. 2 and FIG. 7, the write control circuit 200 includes a switching unit 210 including a first switching device 210a and a second switching device 210b. The write control circuit 200 also includes a second register 220. The second register 220 is connected to the first control signal terminal SW1. The first switching device 210a has an control terminal connected to the first control signal terminal SW1, an input terminal connected to the data signal terminal Vdata, and an output terminal connected to the first data line DATA1. The second register 220 is also connected to the second control signal terminal SW2. The second switching device 210b has a control terminal connected to the second control signal terminal SW2, an input terminal connected to the data signal terminal Vdata, and an output terminal connected to the second data line DATA2.

Exemplarily, as shown in FIG. 4, if k=2, for 3 columns by 4 rows of pixel driving circuits, three switching units 210 and three data signal terminals Vdata are involved, and the specific implementation of each switching unit 210 is the same as the implementation of the above-mentioned 1 column by 4 rows of pixel driving circuits. The three switching units 210 are the first switching unit 211, the second switching unit 212, and the third switching unit 213, respectively. The three data signal terminals Vdata are the first data signals terminal Vdata1, the second data signal terminal Vdata2, and third data signal terminal Vdata3 respectively, and the specific connection manner is as described above.

In a specific implementation, a matching signal can be provided to the second register 220 through the matching control circuit 300, so that the second register 220 provides a corresponding control signal to control the first switching device 210a or the second switching device 210b in each switching unit 210 to be turned on, and accordingly cause the first data line DATA1 or the second data line DATA2 to transmit a data signal.

For example, when the first register 102 provides a scanning signal to the first row of pixel driving circuits (first pixel driving circuit D1) of each column, the matching control circuit 300 sends a first matching signal to the second register 220, so that the second register 220 sends a first control signal to the first switching device 210a of the three switching units 210. The first switching device 210a of each switching unit 210 is turned on, so that a data signal corresponding to each switching unit 210 is transmitted to the first row of pixel driving circuits through the first data line DATA1. When the period for transmitting the data signal reaches T/2, and the first register 102 starts to provide a scanning signal to the second row of pixel driving circuits (second pixel driving circuit D2) of each column, the matching control circuit 300 sends a second matching signal to the second register 220, so that the second register 220 sends a second control signal to the second switching device 210b of each switching unit 210. The second switching device 210b of each switching unit 210 is turned on, so that a data signal corresponding to each switching unit 210 is transmitted to the second row of pixel driving circuits through the second data line DATA2. When the period of transmitting the data signal reaches T/2, the first register 102 provides a scanning signal to the third row of pixel driving circuits (third pixel driving circuit D3) of each column, and the matching control circuit 300 sends a first matching signal to the second register 220, so that the second register 220 sends a first control signal to the first switching device 210a of the three switching units 210. The first switching device 210a of each switching unit 210 is turned on, so that the data signal corresponding to each switching unit 210 is transmitted to the third row of pixel driving circuits through the first data line DATA1. When the period of transmitting the data signal reaches T/2, the first register 102 provides a scanning signal to the fourth row of pixels driving circuits (fourth pixel driving circuit D4) of each column, and the matching control circuit 300 sends a second matching signal to the second register 220, so that the second register 220 sends a second control signal to the second switching device 210b of each switching unit 210. The second switching device 210b of each switching unit 210 is turned on, so that a data signal corresponding to each switching unit 210 is transmitted to the fourth row of pixel driving circuits through the second data line DATA2.

Figure 8:
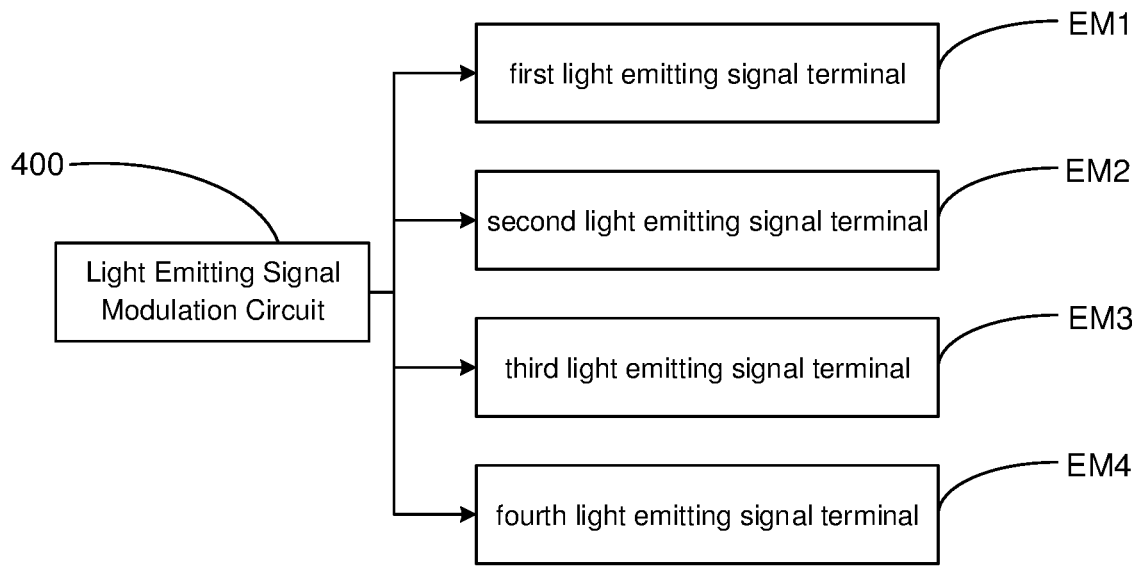
FIG. 8 is a structure block diagram of a light emitting signal modulation circuit according to an embodiment of the present disclosure.

Optionally, as shown in FIG. 1 and FIG. 8, the signal control apparatus provided according to the embodiment of the present disclosure may further include a light emitting signal modulation circuit 400 connected to the matching control circuit 300. The matching control circuit 300 controls the light emitting signal modulation circuit 400 to generate a light emitting signal at the end of the data signal writing phase, to control the pixel driving circuit to drive the light emitting device to emit light.

Specifically, for one row of pixel driving circuits, there is one light emitting signal terminal EM. When there is M rows of pixel driving circuits, the light emitting signal modulation circuit is connected to M light emitting signal terminals, and the M light emitting signal terminals EM are connected to M rows of pixel driving circuits one by one. The M light emitting signal terminals EM are connected to corresponding pixel driving circuits.

For example, for the 3 columns by 4 rows of pixel driving circuits shown in FIG. 4, the light emitting signal modulation circuit 400 is connected to the first light emitting signal terminal EM1, the second light emitting signal terminal EM2, the third light emitting signal terminal EM3, and the fourth light emitting signal terminal EM4. The first light emitting signal terminal EM1 is connected to the first row of pixel driving circuits, the second light emitting signal terminal EM2 is connected to the second row of pixel driving circuits, the third light emitting signal terminal EM3 is connected to the third row of pixel driving circuits, and the fourth light emitting signal terminal EM4 is connected to the fourth row of pixel driving circuits.

In a specific implementation, when the first register 102 starts to provide a scanning signal to the first row of pixel driving circuits, the matching control circuit 300 controls the light emitting signal modulation circuit 400 to generate a first light emitting signal when the first row of pixel driving circuits ends the data signal writing phase, and the first light emitting signal controls the first row of pixel driving circuits to drive the light emitting device thereof to emit light.

When the period for the first register 102 providing the scanning signal to the first row of pixel driving circuits reaches T/2, and the first register 102 starts to provide the scanning signal to the second row of pixel driving circuits, the matching control circuit 300 controls the light emitting signal modulation circuit 400 to generate a second light emitting signal when the second row of pixel driving circuits ends the data signal writing phase, and the second light emitting signal controls the second row of pixel driving circuits to drive the light emitting device thereof to emit light.

When the period for the first register 102 providing the scanning signal to the first row of pixel driving circuits reaches T, and the period for the first register 102 providing the scanning signal to the second row of pixel driving circuits reaches T/2, the first register 102 starts to provide the scanning signal to the third row of pixel driving circuits, the matching control circuit 300 controls the light emitting signal modulation circuit 400 to generate a third light emitting signal when the third row of pixel driving circuits ends the data signal writing phase, and the third light emitting signal controls the third row of pixel driving circuits to drive the light emitting device thereof to emit light.

When the period for the first register 102 providing the scanning signal to the second row of pixel driving circuits reaches T, and the period for the first register 102 providing the scanning signal to the third row of pixel driving circuits reaches T/2, the first register 102 starts to provide the scanning signal to the fourth row of pixel driving circuits, the matching control circuit 300 controls the light emitting signal modulation circuit 400 to generate a fourth light emitting signal when the fourth row of pixel driving circuits ends the data signal writing phase, and the fourth light emitting signal controls the fourth row of pixel driving circuits to drive the light emitting device thereof to emit light.

Figure 10:
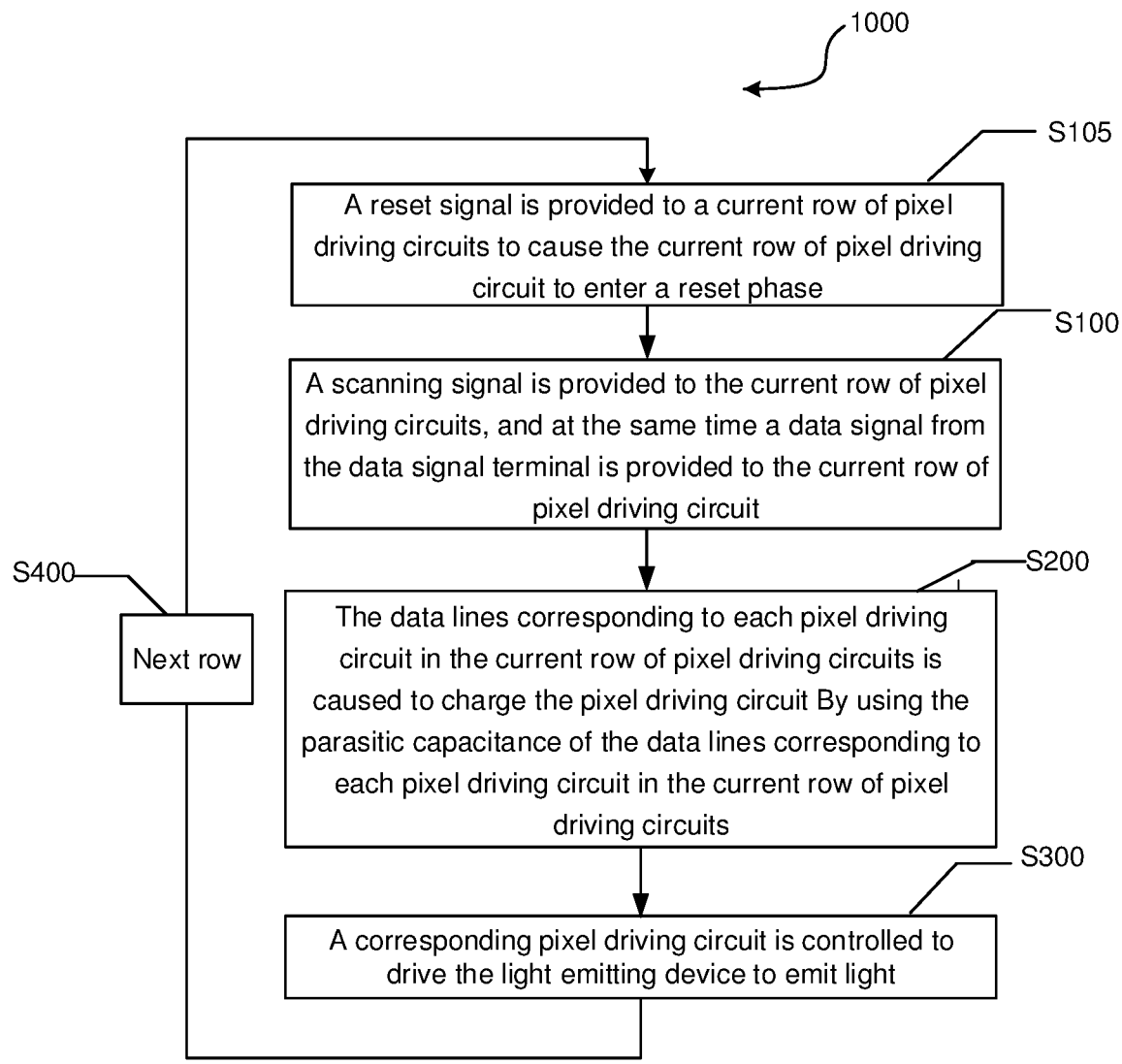
FIG. 10 is a flow chart of a display control method according to an embodiment of the present disclosure.

It should be noted that the specific form of the pixel driving circuit involved in the embodiment of the present disclosure is various. As shown in FIG. 10, the pixel driving circuit may include: a first transistor M1, a second transistor M2, and a third transistor M3, a fourth transistor M4, a fifth transistor M5, a sixth transistor M6, a seventh transistor M7, a storage capacitor C, and light emitting device L. The first transistor M1, the second transistor M2, the third transistor M3, the fourth transistor M4, the fifth transistor M5, the sixth transistor M6, and the seventh transistor M7 are all PMOS transistors, and have a characteristic of being turned on by a low-level signal and turned off by a high-level signal.

The first transistor M1 has a control terminal connected to a first scanning signal terminal G1, an input terminal connected to an initial signal terminal Vinit, and an output terminal connected to a first plate of the storage capacitor C. A second plate of the storage capacitor C is connected to a first power signal terminal ELVDD.

The fifth transistor M5 has a control terminal connected to a light emitting signal terminal EM, an input terminal connected to the first power signal terminal ELVDD, and an output terminal connected to an input terminal of the third transistor M3.

The fourth transistor M4 has a control terminal connected to a second scanning signal terminal G2, an input terminal connected to the data signal terminal Vdata, and an output terminal connected to the input terminal of the third transistor M3.

The output terminal of the first transistor M1 is also connected to the control terminal of the third transistor M3, and the output terminal of the third transistor M3 is connected to an input terminal of the second transistor M2 and an input terminal of the sixth transistor M6 respectively. An output terminal of the second transistor M2 is connected to the first plate of the storage capacitor C, and a control terminal of the second transistor M2 is connected to the second scanning signal terminal G2. A control terminal of the sixth transistor M6 is connected to the light emitting signal terminal EM, and an output terminal of the sixth transistor M6 is connected to a positive electrode of the light emitting device L. A negative electrode of the light emitting device L is connected to a second power signal terminal ELVSS.

The seventh transistor M7 has a control terminal connected to a reset signal terminal RESET, an input terminal connected to the initial signal terminal Vinit, and an output terminal connected to the positive electrode of the light emitting device L.

Figure 11:
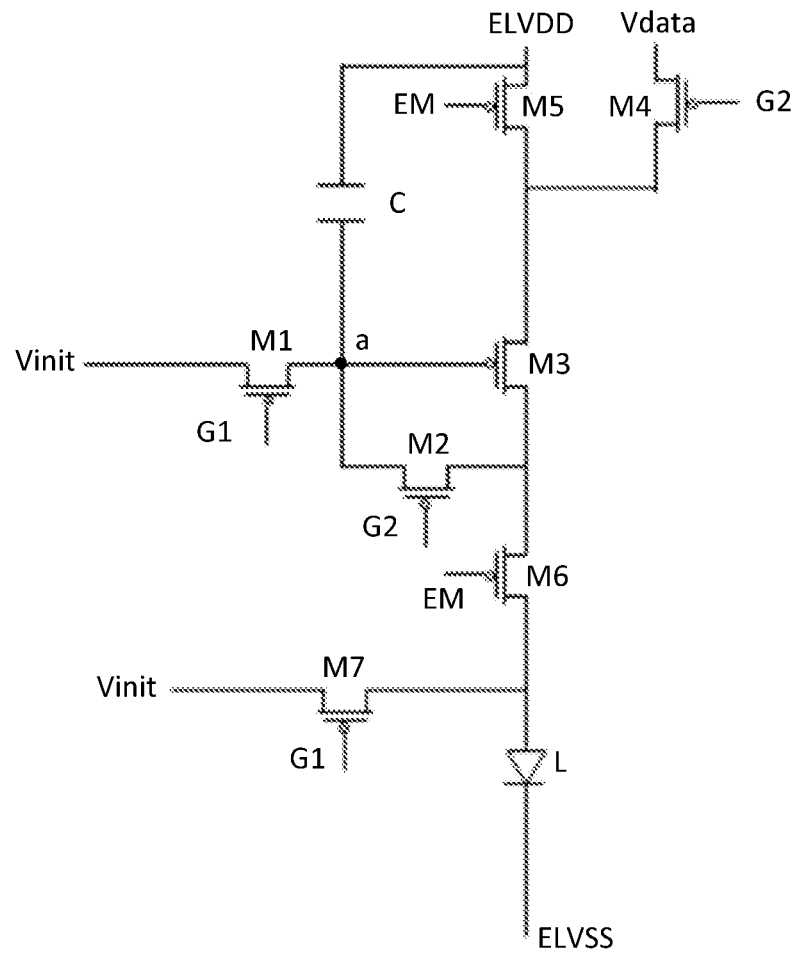
FIG. 11 is a circuit structure diagram of a pixel driving circuit according to an embodiment of the present disclosure.
Figure 12:
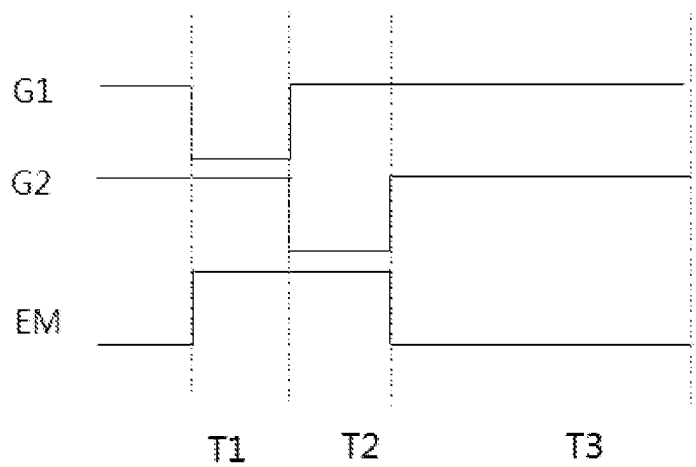
FIG. 12 is a timing diagram of a pixel driving circuit according to an embodiment of the present disclosure.

As shown in FIG. 11, in a first time period T1, the first scanning signal terminal G1 provides a low-level reset signal, the first transistor M1 is turned on; the seventh transistor M7 is turned on, so that an initial voltage is written into the first plate of the storage capacitor C, and the node a is reset, a voltage of the node a is equal to the voltage of the initial signal; the second scanning signal terminal G2 provides a high-level scanning signal, and the second transistor M2 and the fourth transistor M4 are all turned off; the light emitting signal terminal EM provides a high-level light emitting signal, and the fifth transistor M5 and the sixth transistor M6 are turned off.

In a second time period T2, the first scanning signal terminal G1 provides a high-level reset signal, and the first transistor M1 and the seventh transistor M7 are both turned off; the light emitting signal terminal EM provides a high-level light emitting signal, so that the fifth transistor M5 and the sixth transistor M6 are turned off; the second scanning signal terminal G2 provides a low-level scanning signal, the second transistor M2 and the fourth transistor M4 are turned on, and the third transistor M3 is turned on under the control of the initial signal voltage; when the voltage of the data signal is written into the first plate of the storage capacitor C through the fourth transistor M4, the third transistor M3 and the second transistor M2, the voltage of the node a is equal to Vdata+Vth, wherein Vdata is a data signal voltage, and Vth is a compensation voltage.

In a third time period T3, the first scanning signal terminal G1 provides a high-level reset signal, and the first transistor M1 and the seventh transistor M7 are both turned off; the second scanning signal terminal G2 provides a high-level scanning signal, and the second transistor M2 and the fourth transistor M4 are turned off; the third transistor M3 maintains a turn-on state, and the light emitting signal terminal EM provides a low-level light emitting signal under control of the voltage of the node a, so that the fifth transistor M5 and the sixth transistor M6 are turned on; at this time, a power supply signal supplied from the first power supply signal terminal ELVDD drives the light emitting device L to emit light via the fifth transistor M5, the third transistor M3, and the sixth transistor M6.

It should be noted that the fourth transistor M4 in the pixel driving circuit is shown to be connected directly to the data signal terminal Vdata, but it is substantially connected to the switching unit 210 of the write control circuit 200 through the data line in the present disclosure, and writing of data signals is enabled under the control of the write control circuit 200.

As shown in FIG. 1 to FIG. 4 and FIG. 9, the embodiment of the present disclosure further provides a signal control method 900, which is applied to the signal control apparatus according to the foregoing embodiment. The signal control method includes the following steps.

At Step S910, a scanning signal is provided to a pixel driving circuit by for example a phase shifting circuit 100, to cause the pixel driving circuit to enter a data signal writing phase, wherein a phase difference between scanning signals of adjacent two pixel driving circuits of the same group of pixel driving circuits in the same column of pixel driving circuits is T, and a phase difference between scanning signals of adjacent two pixel driving circuits in the same column of pixel driving circuits is T/k, T is a duration of a data signal writing phase of each pixel driving circuit.

At Step S920, a data signal is provided to a pixel driving circuit that receives a scanning signal by for example the matching control circuit 300 for a data writing period of $T_i=T/k$, when the scanning signal is provided to the pixel driving circuit by for example the phase shifting circuit 100.

Figure 9:
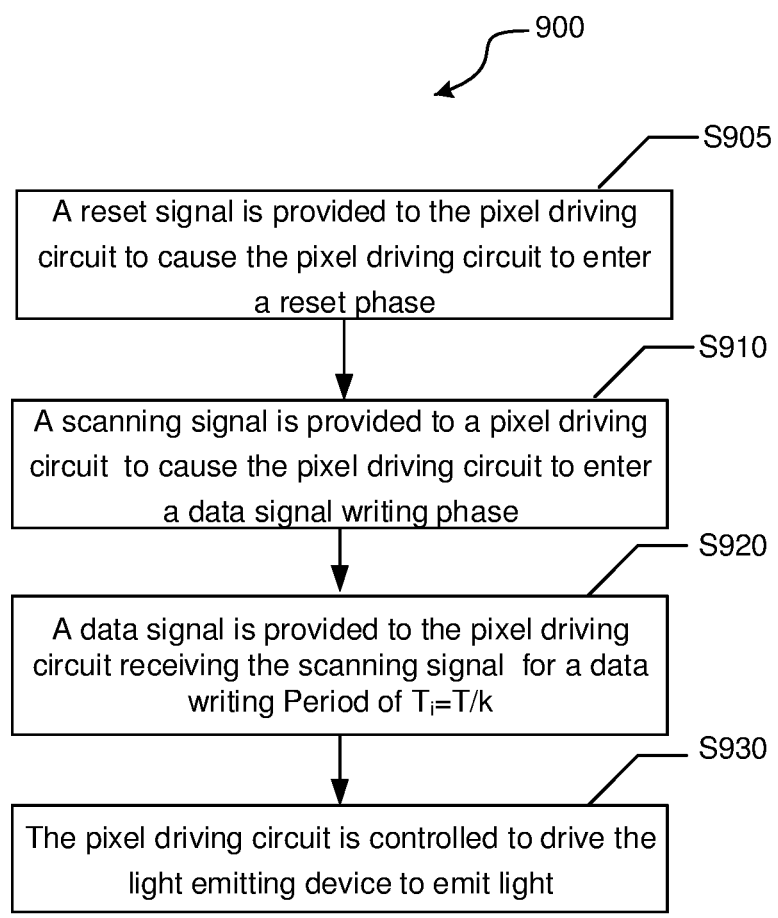
FIG. 9 is a flow chart of a signal control method according to an embodiment of the present disclosure.

Specifically, as shown in FIG. 9, prior to providing the scanning signal to the pixel driving circuit, the signal control method according to the present disclosure may further include Step S905 in which a reset signal is provided to the pixel driving circuit to cause the pixel driving circuit to enter a reset phase, where a duration of the reset phase is T.

As shown in FIG. 9, after the data signal writing phase, the signal control method according to the present disclosure may further include Step S930, in which the pixel driving circuit is controlled to drive the light emitting device to emit light.

The beneficial effects of the signal control method according to the embodiments of the present disclosure compared with the prior art are the same as those of the signal control apparatus according to the foregoing technical solution, and are not described herein.

The embodiment of the present disclosure further provides a display control apparatus, which includes the signal control apparatus according to the embodiment of the present disclosure.

The beneficial effects of the display control apparatus according to the embodiments of the present disclosure compared with the prior art are the same as those of the signal control apparatus according to the foregoing technical solution, and are not described herein.

As shown in FIG. 1 to FIG. 4 and FIG. 10, the embodiment of the present disclosure further provides a display control method 1000 applied to a signal control apparatus according to an embodiment of the present disclosure. The display control method includes the following steps.

At Step S100, i.e., a data writing step, a scanning signal is provided to a current row of pixel driving circuits, so that the current row of pixel driving circuits enters a data signal writing phase, and the duration of the data signal writing phase is T; and at the same time a data signal from the data signal terminal is provided to the current row of pixel driving circuit, so that the current row of pixel driving circuits writes the data signal for a data writing period of $T_i=T/k$; and when the data writing period lapses, it stops providing the data signal to the current row of pixel driving circuits via the data signal terminal, and proceeds to a mutual capacitance charging step.

At Step S200, i.e., the mutual capacitance charging step, the data lines corresponding to each pixel driving circuit in the current row of pixel driving circuits is caused to charge the corresponding pixel driving circuit by using the mutual capacitance of the data lines corresponding to each pixel driving circuit in the current row of pixel driving circuits, until the data signal writing phase of the corresponding pixel driving circuit ends.

As shown in FIG. 10, the display control method according to an embodiment of the present disclosure further includes Step S400, i.e., an updating step, in which it performs a data writing step and a mutual capacitance charging step for the next row of pixel driving circuits.

As shown in FIG. 10, after the mutual-capacitance charging step, the display control method according to an embodiment of the present disclosure further includes Step S300, i.e., a light emitting driving step, in which a corresponding pixel driving circuit is controlled to drive the light emitting device to emit light.

As shown in FIG. 10, before the data writing step, the display control method according to an embodiment of the present disclosure further includes Step S105, i.e., a reset step, in which a reset signal is provided to the current row of pixel driving circuits to cause the current row of pixel driving circuit to enter a reset phase, wherein a duration of the reset phase is T.

The beneficial effects of the display control method according to the embodiments of the present disclosure compared with the prior art are the same as those of the signal control apparatus according to the foregoing embodiments, and are not described herein.

The specific operation process of the display control method according to the embodiment of the present disclosure is described in detail below by using FIG. 3 and FIG. 4 as an example.

In the first step, i.e., the data writing step, the phase shifting circuit 100 provides a scanning signal to the current row of pixel driving circuits. In particular, the phase shifting circuit 100 provides a scanning signal to the first row of pixel driving circuits (the first pixel driving circuit D1), so that the first row of pixel driving circuits enters a data signal writing phase, and at this time the write control circuit 200 controls the first data line DATA1 corresponding to each column of the pixel driving circuit to provide the data signal from the data signal terminal to the first row of pixel driving circuits, so that the first row of pixel driving circuits writes the data signal in a corresponding pixel for a data writing period of $T_i=T/k$. When the data writing period lapses, the write control circuit 200 stops providing the data signal from the data signal terminal to the first row of pixel driving circuits, and proceeds to a mutual capacitance charging step.

In the second step, i.e., the mutual capacitance charging step, the phase shifting circuit 100 continues to provide the scanning signal to the first row of pixel driving circuits, and the mutual capacitance of a data line corresponding to each pixel driving circuit in the first row of pixel driving circuits causes the first data line DATA1 to charge the first row of pixel driving circuits until the data signal writing phase of the first row of pixel driving circuits ends.

In the third step, i.e., the light emitting driving step, a light emitting signal provided from the light emitting signal modulation circuit 400 controls the first row of pixel driving circuits to drive the first row of light emitting devices to emit light.

In the fourth step, i.e., the updating step, a data writing step and a mutual capacitance charging for the next row of pixel driving circuits is performed.

The embodiment of the present disclosure further provides a display apparatus, which includes the display control apparatus according to the above embodiment.

The beneficial effects of the display apparatus according to the embodiment of the present disclosure compared with the prior art are the same as those of the signal control apparatus according to the foregoing embodiment, and are not described herein.

The display apparatus provided in the foregoing embodiment may be any product or part having a display function, such as a mobile phone, a tablet computer, a television, a display, a notebook computer, a digital photo frame, or a navigator.

In the description of the above embodiments, specific features, structures, materials or characteristics may be combined in any suitable manner in any one or more embodiments or examples.

The above description is only the specific embodiment of the present disclosure, but the scope of the present disclosure is not limited thereto, and any person skilled in the art can easily conceive of changes or substitutions within the technical scope of the present disclosure. Such changes or substitutions should be included within the scope of protection of the present disclosure. Therefore, the scope of protection of the present disclosure should be subject to the scope of protection of the claims.

We claim:

1. A signal control apparatus for a display apparatus, the display apparatus comprising M rows by N columns of pixel driving circuits arranged in an array, wherein the M pixel driving circuits of each column of pixel driving circuits are divided into k groups, wherein k is greater than or equal to 2 and less than N, the ith pixel driving circuit of each column of pixel driving circuits is assigned to the [i Module k]th group, and the same group of pixel driving circuits are connected to a same data line to receive a data signal, and data lines connected to different groups of pixel driving circuits are different, the signal control apparatus comprising:
   a phase shifting circuit configured to provide a scanning signal to a pixel driving circuit to cause the pixel driving circuit to enter a data signal writing phase, wherein a phase difference between scanning signals of adjacent two pixel driving circuits in a same group of pixel driving circuits in a same column of pixel driving circuits is equal to T, and a phase difference between scanning signals of adjacent two pixel driving circuits in the same column of pixel driving circuits is equal to T/k, T being a duration of the data signal writing phase of each pixel driving circuit;
   a write control circuit connected to a data signal terminal, and configured to provide a data signal from the data signal terminal to the pixel driving circuit for a data writing period of $T_i=T/k$; and
   a matching control circuit connected to the phase shifting circuit and the write control circuit, and configured to control the write control circuit to provide the data signal to a pixel driving circuit that receives a scanning signal when the phase shifting circuit provides the scanning signal to the pixel driving circuit.

2. The signal control apparatus according to claim 1, wherein a frequency of the data signal provided from the data signal terminal is λ0, wherein T=k/(λ0×M).

3. The signal control apparatus according to claim 1, wherein the phase shifting circuit includes a phase shifter and a first register, the phase shifter is connected to an input terminal of the first register, an output terminal of the first register is connected to M pairs of scanning signal terminals, and the M pairs of scanning signal terminals correspond to M pixel driving circuits in the same column of pixel driving circuits one by one,
   each pair of scanning lines includes a first scanning terminal and a second scanning terminal, a reset signal provided from the first scanning terminal is configured to control a duration of a reset phase of a corresponding pixel driving circuit, and a scanning signal provided from the second scanning terminal is configured to control a duration of a data signal writing phase of a corresponding pixel driving circuit, the phase shifter is configured to modulate a trigger signal such that a phase difference between the reset signal and the scanning signal provided from the first register according to the trigger signal is equal to T, and the matching control circuit is connected to the first register, and configured to control the write control circuit to provide the data signal to a pixel driving circuit that receives a scanning signal when the first register provides the scanning signal to the pixel driving circuit.

4. The signal control apparatus according to claim 3, wherein the write control circuit includes N switching units, and the N switching units correspond to N data signal terminals and N columns of pixel driving circuits one by one, and each switching unit has a control terminal connected to the matching control circuit, an input terminal connected to a corresponding data signal terminal, and an output terminal connected to k data lines of a corresponding column of pixel driving circuits.

5. The signal control apparatus according to claim 4, wherein the write control circuit further includes a second register and k control signal terminals that correspond to the switching units, each switching unit includes k switching devices, and k control signal terminals correspond to k switching devices included in each switching unit one by one, the second register is connected to the matching control circuit and the k control signal terminals, and the k control signal terminals are connected to control terminals of the k switching devices included in each switching unit respectively, input terminals of the k switching devices included in each switching unit are connected to corresponding data signal terminals, and output terminals of the k switching devices included in each switching unit are connected to k data lines of a corresponding column of pixel driving circuits respectively, and the second register is configured to control the k switching devices in each switching units to be sequentially turned on, such that a time difference between turn-on times of adjacent two switching devices in each switching unit is equal to T/k, and each switching device remains to be turned on for a period of T/k.

6. The signal control apparatus according to claim 1, further comprising a light emitting signal modulation circuit connected to the matching control circuit, wherein the matching control circuit is configured to control the light emitting signal modulation circuit to generate a light emitting signal at the end of the data signal writing phase, and control the pixel driving circuit to drive a light emitting device to emit light.

7. A signal control method applied to the signal control apparatus of claim 1, comprising:

providing a scanning signal to a pixel driving circuit, so that the pixel driving circuit enters a data signal writing phase, wherein a phase difference between scanning signals of adjacent two pixel driving circuits in the same group of pixel driving circuits in the same column of pixel driving circuits is equal to T, and a phase difference between scanning signals of adjacent two pixel driving circuits in the same column of pixel driving circuits is equal to T/k, T being a duration of the data signal writing phase of each pixel driving circuit; and providing a data signal to a pixel driving circuit that receives a scanning signal for a data writing period of $T_i$=T/k, when the scanning signal is provided to the pixel driving circuit.

8. The signal control method according to claim 7, before providing the scanning signal to the pixel driving circuit, further comprising:

providing a reset signal to the pixel driving circuit to cause the pixel driving circuit to enter a reset phase, wherein a duration of the reset phase is equal to T.

9. The signal control method according to claim 7, after the data signal writing phase, further comprising:

controlling the pixel driving circuit to drive a light emitting device to emit light.

10. A display control apparatus comprising the signal control apparatus of claim 1.

11. A signal control method applied to the signal control apparatus of claim 1, comprising:

a data writing step of providing a scanning signal to a current row of pixel driving circuits, so that the current row of pixel driving circuits enters a data signal writing phase, a duration of the data signal writing phase is equal to T, and at the same time, providing a data signal from a data signal terminal to the current row of pixel driving circuit, such that the current row of pixel driving circuits writes the data signal for a data writing period of $T_i$=T/k; when the data writing period lapses, stopping providing the data signal to the current row of pixel driving circuits via the data signal terminal, and proceeding to a mutual capacitance charging step;

the mutual capacitance charging step of utilizing a mutual capacitance of a data line corresponding to each pixel driving circuit in the current row of pixel driving circuits, so that the data line corresponding to each pixel driving circuit in the current row of pixel driving circuits charges the corresponding pixel driving circuit until the data signal writing phase of the pixel driving circuit ends.

12. The signal control method according to claim 11, further comprising:

performing the data writing step and the mutual capacitance charging step for a next row of pixel driving circuits.

13. The signal control method according to claim 11, after the mutual capacitance charging step, further comprising:

a driving step of controlling the pixel driving circuit to drive a light emitting device to emit light.

14. The signal control method according to claim 11, before the data writing step, further comprising:

a resetting step of providing a reset signal to the current row of pixel driving circuits to cause the current row of pixel driving circuits to enter a reset phase, wherein a duration of the reset phase is equal to T.

15. A display apparatus comprising the display control apparatus of claim 10.

* * * * *